United States Patent [19]

Johnston

[11] Patent Number: 4,780,600

[45] Date of Patent: Oct. 25, 1988

[54] OPTICAL DISPLACEMENT TRANSDUCER

[75] Inventor: James S. Johnston, Bognor Regis, England

[73] Assignee: Rosemount Limited, United Kingdom

[21] Appl. No.: 1,782

[22] Filed: Jan. 9, 1987

[30] Foreign Application Priority Data

Jan. 10, 1986 [GB] United Kingdom ............... 8600591
Jun. 10, 1986 [GB] United Kingdom ............... 8614074

[51] Int. Cl.⁴ .............................................. G06F 15/20
[52] U.S. Cl. ................................... 235/375; 235/454;
235/462; 235/473; 235/494; 250/237 G; 341/14
[58] Field of Search ............... 235/462, 466, 473, 487,
235/375, 454, 494; 340/347 P

[56] References Cited

U.S. PATENT DOCUMENTS

| | | | |
|---|---|---|---|
| 3,987,278 | 10/1976 | Van Elzakker et al. | 235/462 X |
| 4,110,610 | 8/1978 | Mueller et al. | 340/347 P X |
| 4,286,145 | 8/1981 | Palmer | 235/454 |
| 4,291,976 | 9/1981 | McMahon | 340/347 P X |
| 4,439,672 | 3/1984 | Salaman | 235/463 |
| 4,510,383 | 4/1985 | Ruppender | 235/462 |
| 4,631,519 | 12/1986 | Johnston | 340/347 P |
| 4,678,898 | 7/1987 | Rudland | 235/468 |

Primary Examiner—Patrick R. Salce
Assistant Examiner—Marc S. Hoff
Attorney, Agent, or Firm—Kinney & Lange

[57] ABSTRACT

An optical displacement sensor has an optically detectable coded track movable relative to a mask. The track is illuminated by light conducted by an optical fibre from a remote light source and the image of the track is focussed by a mirror on to the aperture of a second fibre. The mirror is mechanically movable to scan the image of the code over the fibre end to produce light pulses in the fiber which can be decoded at a remote receiver. The mirror is actuated electrically by electric energy from a photo-voltaic cell illuminated by light from a third fiber. Bits in the coded track are only partially opaque but the mask is fully opaque so the edges of the mask can be recognized by the receiver as the mirror is scanned.

16 Claims, 2 Drawing Sheets

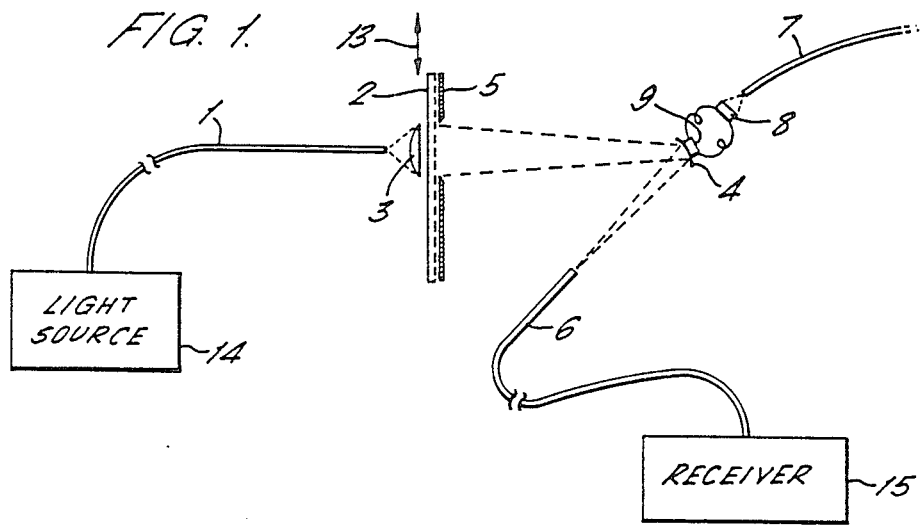
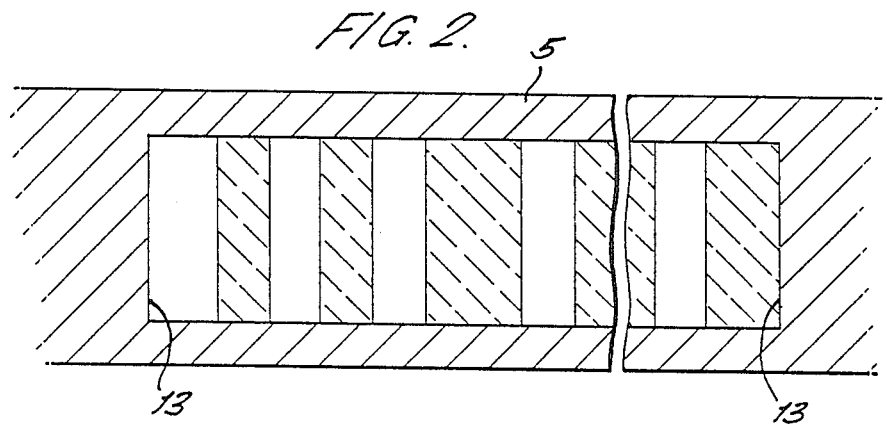
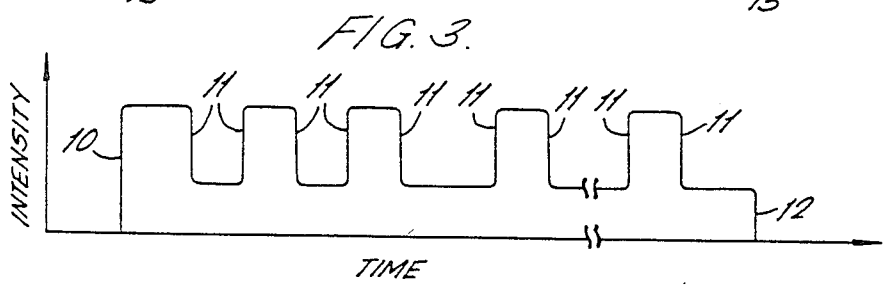

OPTICAL DISPLACEMENT TRANSDUCER

BACKGROUND OF THE INVENTION

1. Field of the Invention

The present invention relates to displacement sensing apparatus and in particular optical displacement transducers.

2. The Prior Art

Optical displacement transducers are known in which a coded track is moved between a source of light and a photo detector so that the displacement, or the position of the track relative to the transducer, can be determined. In a simple form of such transducer, the track can comprise an array of identical marks along its length and movement along the track is detected by counting the marks passing a reading head. This arrangement requires the transducer to keep a continuous count of the marks in order to provide an indication of the position along the track. Such a system is vulnerable in the event of a power failure resulting in loss of the latest count value.

Alternative arrangements which are known employ tracks from which a binary word can be read at any position along the track, with the word uniquely defining the position along the length of the track. The binary word representing the position along the track may be read by reading separate bit indications across the width of the track, for example where the track is of the form commonly used in shaft encoders. In an alternative example the track may be formed as a pseudo random binary sequence (PRBS) whereupon the unique binary word comprises a predetermined minimum number of adjacent bits along the length of the track. Examples of this latter arrangement are contained in GB-A-No.2126444 (corresponding to U.S. Ser. No. 606,814).

In either of the above cases, it has hitherto been necessary to provide some electronic circuitry at the transducer with appropriate power supply, in order to develop at the transducer electrical signals representing the displacement of position read by the transducer. As a result, where, as in most cases, the displacement value provided by the transducer is required at an instrument or apparatus somewhat distant from the transducer, the electrical signals indicating the displacement must be transmitted by means of electrical wires. Furthermore, the electrical power to the transducer must be supplied along wires.

In some applications, it is desirable to provide transducers for measuring various parameters, including for example displacement, which contain no electronic components and which include no electrical interconnections between the transducer and remote apparatus in which the measured parameter is to be utilised. It has been proposed to employ transducers which can be connected to the remote utilisation apparatus by means of optical fibres. However, there has as yet been no satisfactory proposal for employing solely optical fibre interconnections between utilisation apparatus and an optical displacement transducer of the kind described above in which a binary word is read from the track to identify the position along the length of the track.

BRIEF SUMMARY OF THE INVENTION

According to the present invention an optical displacement transducer comprises an optically detectable coded track and means to read from the track a binary word uniquely defining the position along the track, wherein said means to read comprises a light source, optical fibre means for conducting from the transducer to a remote location a light signal serially encoded with said binary word, optical scanning means which is mechanically movable to scan the binary word on the track to generate from said light source said serially encoded light signal in said optical fibre means, electric actuating means to effect the scanning movement of the optical scanning means, and a photo electric conversion device connected to provide electric motive power to the actuating means from light incident on the conversion device. In this way, the two previously identified problems of providing electrical power to a transducer of this kind, and conducting away the electrical signals indicating the measured displacement, are obviated. The only electrically operated component of the transducer is the electric actuating means to effect the scanning movement of the optical scanning means. This is powered by electricity generated by the photo electric conversion device which itself forms part of the transducer. The binary word indicating the measured position along the track is converted by the transducer to a serially encoded light signal in optical fibre means wherein the signal can be conducted from the transducer to a remote location.

Conveniently, said light source comprises optical fibre means to conduct light to the transducer from the remote location. This optical fibre means may be in addition to the aforementioned optical fibre means for conducting the serially encoded light signal from the transducer to the remote location. However in one embodiment, both optical fibre means are together constituted by a single optical fibre. This can be accomplished by beam splitting techniques at each end of the optical fibre.

In one example there may be additional optical fibre means conducting light from the remote location to the photo electric conversion device to provide said light incident thereon. However, alternatively the light incident on the conversion device may be derived from said light source. In this latter arrangement there may then be only a single optical fibre interconnecting the transducer and the remote location.

In one arrangement, the optical scanning means may comprise a partially reflecting mirror located in front of the conversion device, whereby light reflected by the mirror generates the serially encoded light signal and light transmitted through the mirror is incident on the conversion device.

The optical scanning means may be arranged to focus an image of the binary word on the track on to an end of the optical fibre means for conducting the light signal to the remote location, and to scan said image across the end. Alternatively, the optical scanning means may be arranged to focus light from said light source on to the binary word on the track to provide an illuminated portion covering at most one bit length of the word, and then scan the illuminated portion along the word.

In preferred embodiments, the coded track is a PRBS and the binary word comprises a determined number of adjacent bits along the sequence sufficient to define the position along the sequence uniquely.

Conveniently then, the binary words of the coded track are formed of bits which are optically distinguishable, whereby bits representing a first logic state have a first optical brightness when scanned and bits representing a second state have a second optical brightness which is distinguishable from said first optical brightness, and said means to read includes window means, relative to which the track is movable, the window means defining a window length of the track to be scanned by the optical scanning means which window length contains at least said determined number of adjacent bits, the scanning means being arranged to scan over a scan length in excess of said window length so that the window means at each end of the window length is scanned also, and the window means having a third optical brightness when scanned which is distinguishable from said first and second optical brightnesses, whereby the edges of the serially encoded light signal corresponding to the window length of coded track can be determined.

By this arrangement, the window itself provides a datum in the serially encoded light signal, against which the binary word can be set in order to determine the indicated position. The above described apparatus may be used in combination with receiving apparatus at said remote location receiving said serially encoded light signal on the optical fibre means, the receiving apparatus then including a clock to produce clock pulses at a rate faster than the bit rate of the serially encoded light signal, counting means initiated on detecting a leading edge of the window length in said light signal, to count the numbers of pulses between the leading edge and successive transitions between bits of the received light signal, and analysis means to determine the coarse position along the track as defined by the binary word and the fine position within a single bit of the track.

It may be appreciated that by counting the number of clock pulses from receipt of a leading edge of the window length to receipt of a transition between bits of the unique binary word, the position of the track relative to the window at the transducer can be determined to an accuracy greater than the bit spacing along the track. The accuracy is limited by the frequency of the clock pulses and the precision of the scanning means. Non linearity in the scanning means, i.e. the speed of scan over the scan length and particularly over the window length, can be obviated in an alternative arrangement in which the window means includes a grating of regularly spaced lines perpendicular to the length of the track and having a pitch less than half the spacing between adjacent bits of the coded track, the lines of said grating having said third optical brightness whereby the serially encoded light signal is modulated with a signal corresponding to the grating lines.

Then it is only necessary at receiving means at the other end of the optical fibre means to count the modulation pulses corresponding to successive grating lines between the window leading edge and successive bit transitions, in order to provide the fine position spacing.

The present invention also envisages an optical displacement transducer comprising an optically detectable coded track formed as a PRBS of optically distinguishable bits and means to read from the track a binary word comprising a determined number of adjacent bits along the sequence sufficient to define the position along the sequence uniquely, wherein said means to read comprises a light source, light receiving means for receiving a light signal serially encoded with said binary word, optical scanning means to scan the binary word on the track to generate from said light source said serially encoded light signal at said receiving means, said bits of the PRBS having first and second optical brightnesses when scanned, and window means relative to which the track is movable and defining a window length of the track to be scanned by the optical scanning means, said window length containing at least said determined number of adjacent bits, the scanning means being arranged to scan over a scan length in excess of said window length so that the window means at each end of the window length is scanned also, and the window means having a third optical brightness, when scanned which is distinguishable from said first and second optical brightness, whereby the edges of the serially encoded light signal corresponding to the window length of coded track can be determined.

In this aspect of the invention the light receiving means need not include optical fibre means, but may be any form of light receiver including for example a single photo-detector. Further, where the optical scanning means is mechanically movable, it may be actuated by any suitable arrangement including electric actuation from a local power supply: the photo electric conversion device is not essential.

Examples of the present invention will now be described in more detail with reference to the accompanying drawings.

BRIEF DESCRIPTION OF THE DRAWINGS

FIG. 1 is a diagrammatic representation of an embodiment which exemplifies the principles of the present invention;

FIG. 2 is an enlarged view of a portion of track and mask employed in the embodiment of FIG. 1;

FIG. 3 is a graphical representation of the serially encoded light signal representing the position measured by the transducer of FIG. 1;

DETAILED DESCRIPTION OF THE PREFERRED EMBODIMENTS

Figure 4:
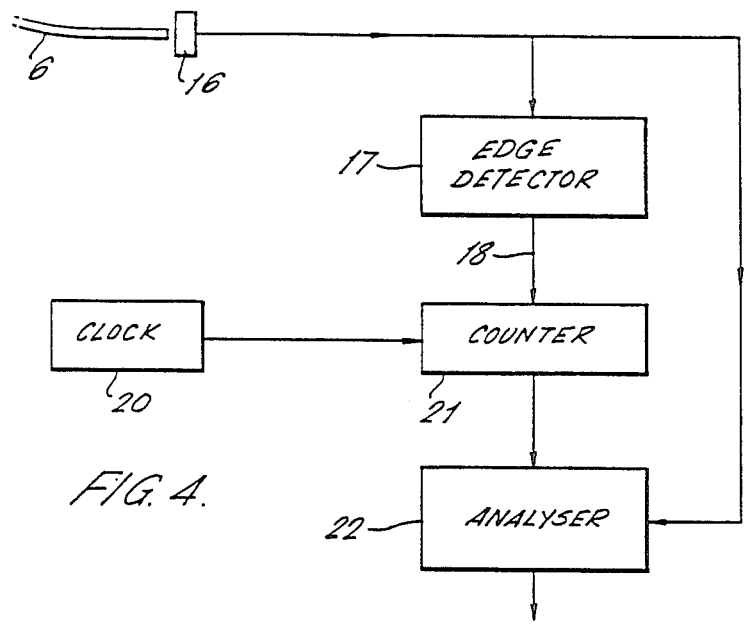
FIG. 4 is a block diagram of the receiver of FIG. 1.

Referring to FIGS. 1 and 2, the optical transducer comprises a track 2 which is movable, i.e. in the direction of arrows 13 relative to reading means constituted by the remaining elements illustrated in the Figure. The track 2 is preferably coded with a Pseudo Random Binary Sequence (PRBS) with the bits of the code being optically distinguishable, e.g. transparent regions being representative of a logic "1" and partially opaque regions being representative of logic "0". Light from a remote light source 14 is conducted to the transducer along a length of optical fibre 1. The remote light source 14 may be located at utilisation apparatus to which is also supplied, as will be described below, output signals from the transducer. A lens 3 is located to direct light emitted from the end of the fibre 1, through the track 2 and into the aperture of a concave mirror 4 positioned on the other side of the track.

A mask 5 forms a window through which a sufficient length of the track 2 is visible from the mirror 4. As has been mentioned previously, the position along a PRBS track can be determined uniquely from the binary word formed by a predetermined number of adjacent bits of the track. The number of adjacent bits necessary to define the unique word is dependent on the total length of the PRBS. For example, the minimum number of adjacent bits necessary is n to identify the position along a PRBS of N bits in length where $$N=2^n-1.$$

An image of the exposed length of the track 2 seen through the window formed by the mask 5 is focused by the concave mirror 4 at a plane containing the end of an optical fibre 6. Preferably the optics is such that the image of the exposed length of the track 2 is magnified. In any case the image of a single bit at the end of the optical fibre 6 should be substantially greater in width than the light collecting aperture of the fibre.

The mirror 4 is mounted on a coil 9 within the field of a permanent magnet (not shown). A photo voltaic cell 8 is connected to supply current to the coil 9 when the cell 8 is illuminated by light from a further optical fibre 7. The power from the cell 8 when so illuminated is sufficient to cause the coil 9 and the attached mirror 4 to rotate in the magnetic field, thereby scanning the exposed window length of the track 2 across the end of the optical fibre 6.

As a result, a succession of light pulses is produced in the fibre 6 corresponding to the successive bits of the exposed portion of the track 2. These light pulses are conducted by the fibre 6 to a receiver 15 at the utilisation apparatus which may be located remotely. The receiver can then analyse the received light pulses to determine the binary word represented by the pulses and indicating the position along the track 2.

It can be seen that the only connections from the remote location to the transducer are by means of optical fibres 1, 6 and 7.

Conveniently, the bits of the coded track 2 are not completely opaque even when representative of a logic "0" (following the above example). Then, if the mask 5 is itself made completely opaque and the arrangement of the mirror 4 is such that the edges 13 of the mask 5 are also scanned across the end of the fibre 6, it is possible for the receiver to determine the relative positions of the edges 13 of the mask 5 and the coded bits representing the position along the track 2.

The signal received by the receiver 15 may have the form as shown in FIG. 3 where the leading and trailing edges of the widow formed by the mask 5 can clearly be detected at 10 and 12 and distinguished from transitions between adjacent bits of the coded track as at 11.

Referring to FIG. 4, light pulses received along fibre 6 are converted to electronic signals by a photo-detector 16. An edge detector 17 generates a signal on line 18 to identify the leading edge 13 of the mask represented by the leading edge 10 of the waveform in FIG. 3. The receiver also includes a clock 20 and a counter 21 which is initiated on receipt of an edge 10 to count the number of clock pulses. This count is supplied to an analyser 22 together with the light pulse signals to identify the numbers of counts before receipt of the edges 11 between adjacent bits of the binary word. Then, not only can the binary word itself be determined by the analyser to identify the coarse position along the PRBS, but also the distance between the edge 10 and the transitions 11 can be measured to within the spacing of adjacent bits of the binary word, thereby providing a fine position indication.

The degree of accuracy will be dependent, inter alia, on the frequency of the clock and the linearity of the scanning mechanism in the transducer.

The analysis procedure is similar to that described in the above mentioned GB-A-No.2126444.

In practice, the speed of rotation of the mirror 4 in the transducer may not be constant over the scanning range of interest and it may therefore be necessary in the analyser to curve fit the edge positions to a higher order function than a straight line.

Figure 5:
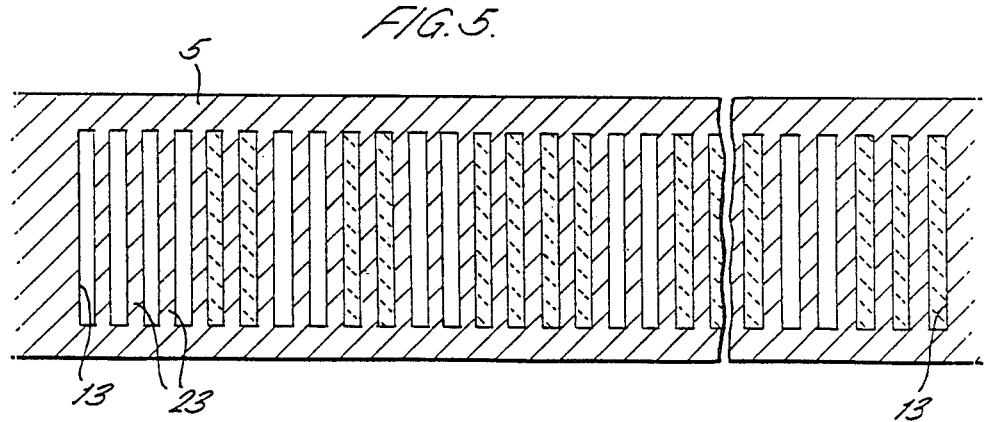
FIG. 5 is an enlarged view of a portion of track and mask employed in a modified embodiment of the transducer of FIG. 1.

In a modified embodiment as illustrated in FIG. 5, the window mask 5 is replaced by one with alternate clear and completely opaque lines 23 within the window area. The lines are directed transversely across the direction of the PRBS track 2 and have a pitch which is substantially less than the bit spacing of the PRBS.

Figure 6:
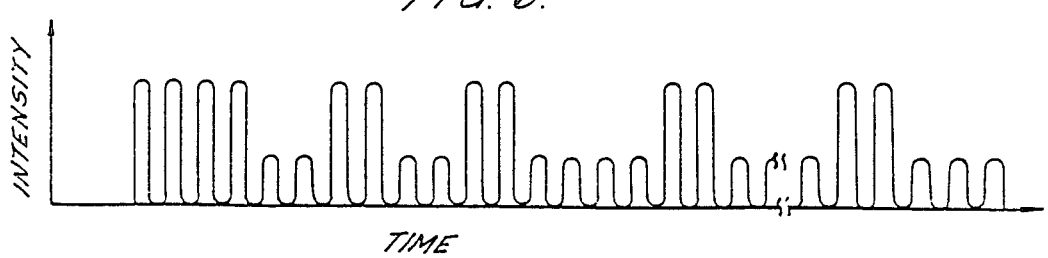
FIG. 6 is a graphical representation of the serially encoded light signal produced by the embodiment of FIG. 5.

These grating lines would then appear as modulation of the coded light signal produced in the optical fibre 6. The signal received at the receiver 15 is thus as represented in FIG. 6 wherein the modulation pulses produced by the grating lines can then be employed instead of the clock pulses of the above example to provide an indication of the fine spacing.

In improved embodiments, the mirror may be formed partially reflecting and located immediately in front of the active surface of the photo voltaic cell. Then some of the light used to illuminate the PRBS track and generate the serially coded light signal in the fibre 6 would pass through the partially reflecting mirror to the photo voltaic cell to energise the mechanical movement of the mirror. In this way the need for a separate power fibre 7 is eliminated.

In a further embodiment, the functions of the fibres 6 and 1 could be interchanged with a light beam from a remote source emitted from fibre 6 and focused to form a small spot scanned along the exposed portion of the track 2 with the transmitted light focused into the fibre 1 connected to a remote receiver. Instead of the scanning being performed by mechanical movement of a mirror, there may instead be a movable lens, prism or slit.

Furthermore, both the light from the remote source 14 to illuminate the track 2, and the serially encoded light signal returning to the receiver 15 can be conducted along a single optical fibre by providing appropriate beam splitting at the ends of the fibre.

It may be appreciated also that other scanning arrangements than mechanical may be employed. For example the light may be deflected electrically using an electro-optic material, or instead a moving light source may be used, such as a moving spot generated on a cathode ray tube or a sequentially energised array of photo-diodes. In another arrangement, if a light beam incident on to the track is swept in wavelength, a stationary prism or refraction grating may be used to scan the beam across the code.

What is claimed is:

1. An optical displacement transducer comprising an optically detectable coded track and means to read from the track a binary word uniquely defining the position along the track, wherein said means to read comprises a light source, optical fibre means for conducting from the transducer to a remote location a light signal serially encoded with said binary word, optical scanning means which is mechanically movable to scan the binary word on the track to generate from said light source said serially encoded light signal in said optical fibre means, electric actuating means to effect the scanning movement of the optical scanning means, and a photo electric conversion device connected to provide electric motive power to the actuating means from light incident on the conversion device.

2. An optical displacement transducer as claimed in claim 1 wherein said light source comprises optical fibre means to conduct light to the transducer from the remote location.

3. An optical displacement transducer as claimed in claim 2 wherein the optical fibre means for conducting the serially encoded light signal from the transducer to the remote location, and the optical fibre means to conduct light from the remote location to the transducer to provide said light source, are together constituted by a single optical fibre.

4. An optical displacement transducer as claimed in claim 1 and including additional optical fibre means conducting light from the remote location to the photo electric conversion device to provide said light incident thereon.

5. An optical displacement transducer as claimed in claim 1 wherein the light incident on the conversion device is derived from said light source.

6. An optical displacement transducer as claimed in claim 5 wherein the optical scanning means comprises a partially reflecting mirror located in front of the conversion device, whereby light reflected by the mirror generates the serially encoded light signal and light transmitted through the mirror is incident on the conversion device.

7. An optical displacement transducer as claimed in claim 1 wherein the optical scanning means is arranged to focus an image of the binary word on the track on to an end of the optical fibre means for conducting the light signal to the remote location, and to scan said image across the end.

8. An optical displacement transducer as claimed in claim 1 wherein the optical scanning means is arranged to focus light from said light source on to the binary word on the track to provide an illuminated portion covering at most one bit length of the word, and to scan the illuminated portion along the word.

9. An optical displacement transducer as claimed in claim 1 wherein the coded track is a Pseudo-Random Binary Sequence and the binary word comprises a determined number of adjacent bits along the sequence sufficient to define the position along the sequence uniquely.

10. An optical displacement transducer as claimed in claim 9 wherein the binary words of the coded track are formed of bits which are optically distinguishable, whereby bits representing a first logic state have a first optical brightness when scanned and bits representing a second logic state have a second optical brightness which is distinguishable from said first optical brightness, and wherein said means to read includes window means, relative to which the track is movable, the window means defining a window length of the track to be scanned by the optical scanning means which window length contains at least said determined number of adjacent bits, the scanning means being arranged to scan over a scan length in excess of said window length so that the window means at each end of the window length is scanned also, and the window means having a third optical brightness, when scanned which is distinguishable from said first and second optical brightness, whereby the edges of the serially encoded light signal corresponding to the window length of coded track can be determined.

11. An optical displacement transducer as claimed in claim 10 in combination with receiving apparatus at said remote location receiving said serially encoded light signal on the optical fibre means, the receiving apparatus including a clock to produce clock pulses at a rate faster than the bit rate of the serially encoded light signal, counting means initiated on detecting a leading edge of the window length in said light signal, to count the numbers of pulses between the leading edge and successive transitions between bits of the received light signal, and analysis means to determine the coarse position along the track as defined by the binary word and the fine position within a single bit of the track.

12. An optical displacement transducer as claimed in claim 10 wherein the window means includes a grating of regularly spaced lines perpendicular to the length of the track and having a pitch less than half the spacing between adjacent bits of the coded track, the lines of said grating having said third optical brightness whereby the serially encoded light signal is mounted with a signal corresponding to the grating lines.

13. An optical displacement transducer comprising an optically detectable coded track formed as a Pseudo-Random Binary Sequence of optically distinguishable bits and means to read from the track a binary word comprising a determined number of adjacent bits along the sequence sufficient to define the position along the sequence uniquely, wherein said means to read comprises a light source, light receiving means for receiving a light signal serially encoded with said binary word, optical scanning means to scan the binary word on the track to generate from said light source said serially encoded light signal at said receiving means, said bits of the PRBS having first and second optical brightnesses when scanned, and window means relative to which the track is movable and defining a window length of the track to be scanned by the optical scanning means, said window length containing at least said determined number of adjacent bits, the scanning means being arranged to scan over a scan length in excess of said window length so that the window means at each end of the window length is scanned also, and the window means having a third optical brightness, when scanned which is distinguishable from said first and second optical brightness, whereby the edges of the serially encoded light signal corresponding to the window length of coded track can be determined.

14. An optical displacement transducer as claimed in claim 13 wherein said light receiving means includes means for converting said serially encoded light signal to a corresponding electrical signal, and a clock to produce clock pulses at a rate faster than the bit rate of the serially encoded light signal, counting means initiated on detecting a leading edge of the window length in said light signal, to count the numbers of pulses between the leading edge and successive transitions between bits of the received light signal, and analysis means to determine the coarse position along the track as defined by the binary word and the fine position within a single bit of the track.

15. An optical displacement transducer as claimed in claim 13 wherein the window means includes a grating of regularly spaced lines perpendicular to the length of the track and having a pitch less than half the spacing between adjacent bits of the coded track, the lines of said grating having said third optical brightness whereby the serially encoded light signal is modulated with a signal corresponding to the grating lines.

16. An optical displacement transducer as claimed in claim 13 wherein the optical scanning means is mechanically movable.

* * * * *

UNITED STATES PATENT AND TRADEMARK OFFICE
CERTIFICATE OF CORRECTION

PATENT NO. : 4,780,600

DATED : October 25, 1988

INVENTOR(S) : James S. Johnston

It is certified that error appears in the above-identified patent and that said Letters Patent is hereby corrected as shown below:

Column 8, line 17, delete "mounted" and insert --modulated--.

Signed and Sealed this

Eighth Day of August, 1989

Attest:

DONALD J. QUIGG

Attesting Officer

Commissioner of Patents and Trademarks